025080B2

United States Patent
Jonsson et al.

(10) Patent No.: US 9,054,080 B2
(45) Date of Patent: Jun. 9, 2015

(54) METHOD FOR THE PRODUCTION OF AN ELECTRONIC COMPONENT AND ELECTRONIC COMPONENT PRODUCED ACCORDING TO THIS METHOD

(75) Inventors: Guenter Jonsson, Ulm (DE); Hermann Stieglauer, Blaustein (DE)

(73) Assignee: United Monolithic Semiconductors GmbH, Ulm (DE)

( * ) Notice: Subject to any disclaimer, the term of this patent is extended or adjusted under 35 U.S.C. 154(b) by 0 days.

(21) Appl. No.: 13/499,975

(22) PCT Filed: Dec. 21, 2010

(86) PCT No.: PCT/EP2010/070357
§ 371 (c)(1),
(2), (4) Date: Apr. 3, 2012

(87) PCT Pub. No.: WO2011/076782
PCT Pub. Date: Jun. 30, 2011

(65) Prior Publication Data
US 2012/0248612 A1 Oct. 4, 2012

(30) Foreign Application Priority Data
Dec. 23, 2009 (DE) .................. 10 2009 059 303

(51) Int. Cl.
*H01L 29/40* (2006.01)
*H01L 21/44* (2006.01)
(Continued)

(52) U.S. Cl.
CPC ........ *H01L 23/481* (2013.01); *H01L 21/76898* (2013.01); *H01L 23/4827* (2013.01); *H01L 24/02* (2013.01); *H01L 24/03* (2013.01); *H01L 24/05* (2013.01); *H01L 24/29* (2013.01); *H01L 24/32* (2013.01); *H01L 24/83* (2013.01); *H01L 2224/0231* (2013.01); *H01L 2224/02371* (2013.01); *H01L 2224/0239* (2013.01); *H01L 2224/0345* (2013.01); *H01L 2224/03462* (2013.01); *H01L 2224/04026* (2013.01); *H01L 2224/05008* (2013.01); *H01L 2224/05009* (2013.01); *H01L 2224/0508* (2013.01); *H01L 2224/051* (2013.01);
(Continued)

(58) Field of Classification Search
CPC .................................................. H01L 21/76898
See application file for complete search history.

(56) References Cited

U.S. PATENT DOCUMENTS

| 5,698,897 | A * | 12/1997 | Nashimoto et al. | 257/712 |
| 2002/0030267 | A1* | 3/2002 | Suzuki | 257/698 |
| 2007/0045780 | A1* | 3/2007 | Akram et al. | 257/621 |

FOREIGN PATENT DOCUMENTS

| JP | 2004-088062 | 3/2004 |
| JP | 2005-033116 | 2/2005 |

OTHER PUBLICATIONS

Varmazis et al., How to Process the Backside of GaAs Wafers, Semiconductor International, Dec. 2000.
(Continued)

*Primary Examiner* — David Zarneke
(74) *Attorney, Agent, or Firm* — Collard & Roe, P.C.

(57) ABSTRACT

The invention relates to an electronic component having a GaAs semiconductor substrate (HS), semiconductor components (BE) being implemented on the front side thereof, and the back side thereof having a multilayer backside metallization (RM), wherein an advantageous construction of the layer sequence of the backside metallization is proposed, the backside metallization in particular comprising an Au layer as a bonding layer.

22 Claims, 1 Drawing Sheet

Figure 1:
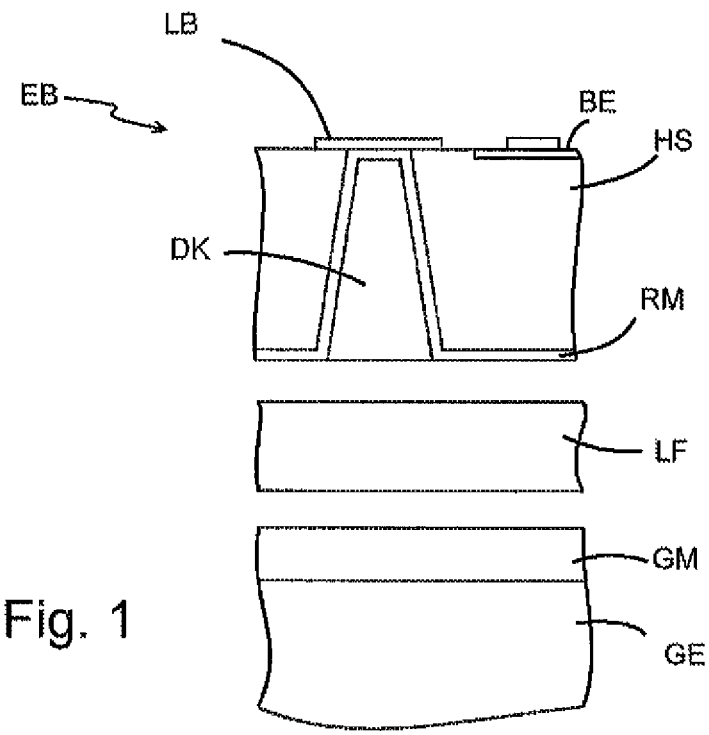

(51) Int. Cl.
  *H01L 23/48* (2006.01)
  *H01L 21/768* (2006.01)
  *H01L 23/482* (2006.01)
  *H01L 23/00* (2006.01)

(52) U.S. Cl.
  CPC ........... *H01L 2224/05144* (2013.01); *H01L 2224/05166* (2013.01); *H01L 2224/05187* (2013.01); *H01L 2224/05548* (2013.01); *H01L 2224/05561* (2013.01); *H01L 2224/05644* (2013.01); *H01L 2224/291* (2013.01); *H01L 2224/32221* (2013.01); *H01L 2224/83101* (2013.01); *H01L 2224/834* (2013.01); *H01L 2224/83815* (2013.01); *H01L 2924/01004* (2013.01); *H01L 2924/01013* (2013.01); *H01L 2924/01032* (2013.01); *H01L 2924/01073* (2013.01); *H01L 2924/01079* (2013.01); *H01L 2924/01082* (2013.01); *H01L 2924/014* (2013.01); *H01L 2924/10329* (2013.01); *H01L 2924/01005* (2013.01); *H01L 2924/0102* (2013.01); *H01L 2924/01023* (2013.01); *H01L 2924/01024* (2013.01); *H01L 2924/01033* (2013.01); *H01L 2924/0104* (2013.01); *H01L 2924/01041* (2013.01); *H01L 2924/01042* (2013.01); *H01L 2924/0105* (2013.01); *H01L 2924/01072* (2013.01); *H01L 2924/01074* (2013.01); *H01L 2924/01075* (2013.01); *H01L 2924/01322* (2013.01)

(56) References Cited

OTHER PUBLICATIONS

International Search Report of PCT/EP2010/070357, Mar. 18, 2011.

* cited by examiner

METHOD FOR THE PRODUCTION OF AN ELECTRONIC COMPONENT AND ELECTRONIC COMPONENT PRODUCED ACCORDING TO THIS METHOD

CROSS REFERENCE TO RELATED APPLICATIONS

This application is the National Stage of PCT/EP2010/070357 filed on Dec. 21, 2010, which claims priority under 35 U.S.C. §119 of German Application No. 10 2009 059 303.9 filed on Dec. 23, 2009, the disclosure of which is incorporated by reference. The international application under PCT article 21(2) was not published in English.

The invention relates to a method for the production of an electronic component and to an electronic component produced according to this method.

In the case of electronic components having at least one semiconductor component on a semiconductor substrate, the waste heat that occurs in the semiconductor component during operation must be conducted away. This is particularly important for high-frequency power components. The at least one component, or typically a monolithically integrated circuit containing a plurality of components, is configured on the front side of the substrate, and the waste heat is conducted away through the substrate, by way of its back side, to a heat sink, and given off by way of a surface of a housing of the component, for example. The substrates frequently have openings that pass through from the back side to the front side of the substrate, so-called via holes, which serve as electrically conductive through-connections from a planar back-side metallization to conductor surfaces on the front side of the substrate.

Typically, a conductive layer made of gold (Au) is deposited on the back side of the substrate, including the via holes, whereby an adhesion-imparting layer, which can contain Ge for polished substrate surfaces, Ti, Ta, W, Pd, or Cr for substrate surfaces that are only coarsely ground, for example, is usually applied for a firm connection of the Au conductive layer with the surface of the semiconductor substrate, and the Au conductive layer is deposited on this layer, preferably galvanically. Ti serves, in particular, only for coarsely ground surfaces of the back side of the substrate, as an adhesion-imparting agent with good mechanical anchoring to the semiconductor material. Due to better properties with regard to fracture resistance and photolithography in the production of the via holes, finely ground back side surfaces are preferred, but these do not demonstrate good mechanical anchoring. For the preferred finely ground surfaces of the back side of GaAs substrates, Ge is therefore generally deposited on the back side of the substrate and in the via holes as an adhesion-imparting layer. Au is deposited on the adhesion-imparting layer, whereby as a rule, a first thin gold layer is sputtered on, and a thicker Au layer is galvanically produced on this, as a conductive layer having great thermal and electrical conductivity. The surface of the back-side metallization that faces the substrate is soldered to a heat sink, whereby typically, a eutectic $AuSn_4$ alloy, particularly in the form of a thin pre-form film, is used as the solder. The surface of the heat sink that faces the substrate or the pre-form film typically also has an Au surface. The soldered connection between substrate and heat sink is susceptible to the formation of cavities that impair the heat transfer, particularly on the side of the substrate. The parameters of the soldering process must be adhered to with close tolerances, in terms of time and temperature, in order to keep defects in the soldered connection as low as possible.

The components on GaAs substrates produced according to the known methods demonstrate degradations and failures, again and again, in the function of components operated at higher power and high frequencies, above all.

In the conference contribution "How to Process the Backside of GaAs Wafers" by Varmazis et al. in Semiconductor International, Dec. 1, 2001, problems and methods of backside metallization of semiconductor substrates with through-connections are discussed.

In order to prevent filling of the through-connections with the melted AuSn solder, which leads to mechanical stresses, it is proposed to cover the surface of the Au layer of the backside metallization with an additional layer composed of Ti, Ni, or Cr, and to remove this additional layer again, by means of a photo mask and an etching process, on the planar surface of the back-side metallization, outside of the through-connections, and to expose the Au surface of the Au layer once again. After the photo mask is removed, the surface is provided by the additional layer in the passage holes, which surface oxidizes and can be wetted only poorly with the AuSn solder.

The present invention is based on the task of indicating a method for the production of an electronic component, particularly on a GaAs substrate, having a back-side metallization formed predominantly by means of an Au layer, as well as a component produced according to this method.

Solutions according to the invention are described in the independent claims. The dependent claims contain advantageous embodiments of the invention.

The invention is based on the recognition that defects that occur in the conventional components are connected to a not insignificant extent with the adhesion metal that is deposited directly onto the semiconductor material of the substrate back side. In particular, although it is true that Ge as an adhesion metal layer leads to very good adhesion on substrate material having a polished or finely ground surface, because of good diffusion into the substrate material, on the other hand the strong diffusion of Ge also brings about disruptions in the boundary surface to the following layer of the back-side metallization, and can actually lead to poor wetting with the solder used for the connection with a heat sink, on the surface of the back-side metallization that faces away from the substrate. These effects can particularly lead to worsening of the removal of waste heat of a component disposed on the front side of the substrate. Furthermore, it has been shown that Ge can migrate through the substrate material to active components, particularly at the edges of passage holes on the front side of the substrate, and can cause degradation of the component properties.

The chemical elements gallium Ga, arsenic As, titanium Ti, gold Au, germanium Ge, nitrogen N, tantalum Ta, tungsten W, palladium Pd, chrome Cr, and others are listed by their abbreviations usually used in chemistry, in each instance.

The use of Au, according to the invention, as a material of the adhesion layer deposited directly onto the semiconductor metal of the back side of the substrate, surprisingly eliminates the aforementioned problems, with reliable adhesion to the substrate. Preferably, the back side of the substrate is polished to an average roughness depth of less than 4 nm before deposition of the Au adhesion layer. Au diffuses into the substrate material from the first Au layer, and this is particularly advantageous for good adhesion on a smooth substrate surface. The thickness of the first Au layer advantageously amounts to at least 25 nm, particularly at least 35 nm. However, the diffusion is clearly weaker than that of Ge, so that no degradation of components takes place. At the same time, Ga also diffuses out of the semiconductor material into the first Au layer.

In order to limit reciprocal diffusion of Au into the semiconductor material and Ga into the first Au layer, the thickness of the first Au layer is advantageously limited to at most 100 nm, particularly at most 75 nm. A preferred layer thickness of the first Au layer lies at approximately 50 nm. The back-side metallization is also deposited in passage holes through the substrate, in conventional manner, whereby preferably, the layer thickness, at least of the first Au layer, is less on the walls of the passage holes than on the back side of the substrate.

In a particularly advantageous embodiment, a diffusion barrier layer is deposited between the first Au layer and the Au conductive layer, preferably directly onto the first Au layer; this barrier layer limits the Au available for diffusion into the substrate material, for one thing, by limiting the layer thickness of the first Au layer, and for another thing also particularly prevents the progression of diffusion of the Ga that migrates out of the substrate material through the first Au layer. The material of the diffusion barrier layer is therefore selected in such a manner that the diffusion coefficient of Ga in the material of the diffusion barrier layer is lower than in the first Au layer. The diffusion barrier layer advantageously contains Ti as an essential component, and N can advantageously be mixed into this, for further reduction of the diffusion of Ga.

The diffusion barrier layer is advantageously also deposited on side flanks of through-connections through the substrate, and advantageously acts as a barrier against the diffusion of atoms of the back-side metallization and/or solder material into the active semiconductor regions, in the region close to the front side.

Advantageously, a second Au layer as a starting metal for galvanic deposition of the Au conductive layer is deposited, particularly sputtered on, between the diffusion barrier layer and the Au conductive layer, particularly directly onto the diffusion barrier layer. The properties of sputtered Au layers differ from galvanically deposited Au layers, for example with regard to the diffusion coefficients of other metals on these layers. In a preferred embodiment, the diffusion barrier layer can be structured with alternating composition in the direction perpendicular to the layer plane, whereby the diffusion barrier layer advantageously consists of Ti in a region on the boundary surface to the first Au layer and/or in a region on the boundary surface to the second Au layer, and TiN is present in a central layer region, as a material having a further greatly reduced diffusion coefficient for Ga.

Additional layers can be deposited on the side of the Au conductive layer that faces away from the substrate, as part of the back-side metallization.

Figure 2:
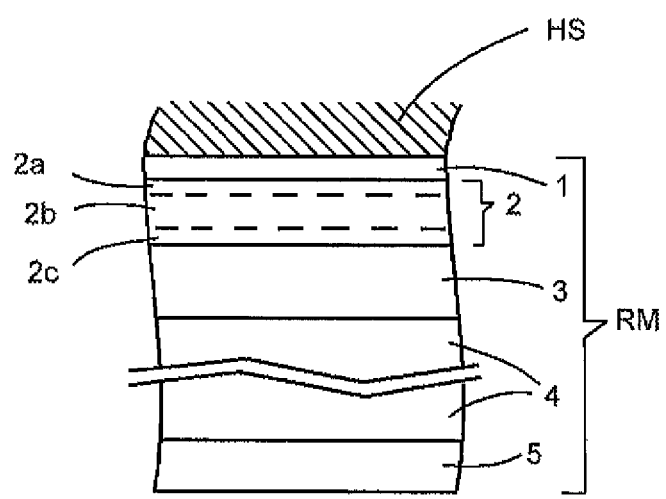

The invention will be demonstrated in greater detail below, using a preferred exemplary embodiment. In this connection, the figures show:

FIG. 1 a section through a component,

FIG. 2 a layer structure of a back-side metallization.

FIG. 1 shows an assembly representation of a semiconductor module having a housing surface over a solder connection. A semiconductor substrate HS carries one or typically multiple semiconductor components BE as well as metallic conductor tracks LB on its front side, which faces upward in FIG. 1. The back side of the semiconductor substrate HS, which is set opposite to the front side, is provided with a back-side metallization RM. Passage holes DK are recessed through the substrate; their walls are also coated with the back-side metallization RM and can form through-connections to conductor tracks LB on the front side of the substrate.

In the typical example shown, the electronic module EB is provided for a good heat-conductive connection to a heat sink, for example a housing GE, for which purpose a metal layer GM is provided on the housing, and the back-side metallization RM of the electronic module can be soldered to the metal layer GM by means of a solder that is present as a thin film, for example.

In this connection, the back-side metallization fulfills not only a function as an electronic conductor along the back side of the substrate, to conductor tracks LB through the passage holes DK, but also a heat-conductive function for carrying away waste power that occurs in components BE during operation, to the housing GE as a heat sink. For the electrical function, a low layer resistance is important; for the heat-conducting function, aside from good heat conductivity, a good connection of the different layers between substrate and housing GE, particularly between substrate and back-side metallization, as well as between back-side metallization and solder layer, is important.

When using germanium as the adhesion layer that stands in direct contact with the GaAs semiconductor material of the back side of the substrate, good heat-conductive contact between substrate and back-side metallization is generally guaranteed. However, it has been shown that Ge can be the cause of disruptions in the heat conduction between back-side metallization and solder layer, and can cause degradations of the properties of the components on the front of the substrate.

FIG. 2 shows a structure, according to the invention, of a back-side metallization composed of multiple layers. The back side of the substrate is advantageously polished to a slight roughness, with an average roughness depth of less than 4 nm. On the back side of the semiconductor substrate HS, a first Au layer 1 is sputtered on as an adhesion layer. A diffusion barrier layer 2 is sputtered onto the first Au layer 1, and a second Au layer 3 is sputtered onto this layer. The diffusion barrier layer 2 preferably consists of Ti in a region 2a on the boundary surface to the first Au layer 1 as well as in a region 2c on the boundary surface to the second Au layer. In a central layer region 2b of the diffusion barrier layer, this layer advantageously consists of TiN.

The diffusion coefficient of Au in GaAs is lower than that of Ge, but sufficiently high to guarantee good, essentially continuous anchoring of the first Au layer on the polished surface of the substrate back side, over its full area. In this way, particularly good heat transfer from the substrate into the adhesion layer is guaranteed. A mechanical adhesion that is typical for Ti adhesion layers, by way of geometric engagement of substrate back side and adhesion layer into one another, is not required. By means of the multi-layer structure of the diffusion barrier layer 2, a reliably firm connection between Ti in the regions 2a, 2c, and the adjacent Au sputtered layers is guaranteed, for one thing, and for another thing, the TiN as the central layer region forms a particularly effective diffusion barrier for Ga from the semiconductor substrate HS. The second Au layer 3 serves as a starting metal for the galvanic deposition of an Au conductive layer 4, the thickness of which makes up at least 50% of the total thickness of the back-side metallization. A final layer 5 can be provided on the galvanically deposited, thick Au conductive layer 4, which layer forms the surface of the back-side metallization that faces the solder, which can also be structured as a sequence of multiple partial layers and, in particular, can once again contain a sputtered Au layer.

The diffusion barrier layer 2 advantageously limits the supply of Au that is available in the first Au layer for diffusion into the semiconductor substrate HS and for the absorption of Ga out of the semiconductor substrate, so that the diffusion process between the first Au layer and the semiconductor substrate can be restricted to the extent required for anchoring. The diffusion coefficient of Ti in GaAs is particularly low, so that the diffusion of Ti out of the region 2a through the first Au layer 1 into the semiconductor substrate HS does not play a role. The diffusion barrier layer, particularly the central region, effectively prevents migration of Ga in the direction of the Au conductive layer 4, where Ga could lead to an increase in the layer resistance, as well as diffusion of Ga all the way to the surface of the total back-side metallization that faces away from the substrate, where disruptions in wetting with solder could occur during the soldering process.

The thickness of the first Au layer 1 on the back side of the semiconductor substrate advantageously amounts to at least 25 nm, particularly at least 35 nm, and at most 100 nm, particularly at most 75 nm. A thickness of the first Au layer 1 of approximately 50 nm is preferred.

The thickness of the diffusion barrier layer is advantageously greater than the thickness of the first Au layer, and advantageously lies between 100 nm and 400 nm, particularly between 150 nm and 300 nm. In the case of a multi-layer structure of the barrier layer, the thickness of the regions 2a, 2c advantageously lies between 5 nm and 30 nm. The layer thickness of the second Au layer 3, as the starting metal for galvanic deposition of the Au conductive layer 4, advantageously lies in a range of 50 nm to 500 nm. The layer thickness of the Au conductive layer 4 amounts to a multiple of the aforementioned layer thicknesses and typically lies in a range between 2000 nm and 5000 nm. The layer thickness of the last layer or layer sequence 5 advantageously lies between 200 nm and 400 nm.

The layer sequence of the layers 1 to 5 of the back-side metallization is advantageously present also as the metallization of the side walls of the passage holes. DK, where advantageously at least the layer thickness of the first Au layer 1 is less than on the back side of the substrate, and does not amount to more than 50% of the layer thickness of this first Au layer 1 on the flat back side of the substrate, particularly on the side walls of the passage holes in the region of the front side of the substrate. In this way, the available supply of Au for diffusion into the semiconductor material is further reduced in the possibly critical vicinity of components BE, and thus the risk of degradation of the components due to gold diffusing into them is further reduced. The demands on anchoring of the adhesion layer in the semiconductor substrate are not as strict in this region as on the back side of the semiconductor substrate, because these regions in the vicinity of the front side of the substrate play a subordinate role for the removal of waste heat. The diffusion barrier layer reduces or prevents the diffusion of atoms out of the layers of the back-side metallization deposited afterward, particularly in the vicinity of the substrate front side, or from solder material that might have gotten into the passage holes, in the direction of the active components.

For the diffusion barrier layer, Ti is preferred as an essential component, but in general, other materials having the properties of a good connection to the adjacent Au layers and a low diffusion coefficient for Ga in these diffusion barrier layers, as well as a low diffusion coefficient of the material of the diffusion barrier layer into GaAs can also be used. Particularly suitable are all the refractory metals, which should be understood to include, in this connection, the non-precious metals of the $4^{th}$, $5^{th}$, and $6^{th}$ secondary group of the periodic system, as well as rhenium, in other words Ti, V, Cr, Zr, Nb, Mo, Hf, Ta, W, Re, as well as their compounds with N, which have a high melting point and are also referred to, in part, as refractory metals in the broader sense.

The characteristics indicated above and in the claims, as well as those that can be derived from the figures, can advantageously be implemented both individually and in different combinations. The invention is not restricted to the exemplary embodiments described, but rather can be modified in many different ways, within the scope of the ability of a person skilled in the art.

The invention claimed is:

1. Method for the production of an electronic component (EB) having at least one semiconductor component (BE) on the front side of a GaAs substrate (HS), wherein the back side of the substrate that faces away from the component is provided with a back-side metallization (RM), in which an adhesion layer is applied to the surface of the substrate material, and afterward, an Au conductive layer (4) having at least 50% of the total thickness of the back-side metallization is deposited, wherein a first Au layer (1) is deposited as an adhesion layer;
wherein a diffusion barrier layer (2) is deposited between the first Au layer (1) and the Au conductive layer (4),
wherein the diffusion barrier layer (2) is deposited at a greater layer thickness than the first Au layer (1); and
wherein the first Au layer (1) is deposited with a layer thickness of at least 25 nm and at most 100 nm.

2. Method according to claim 1, wherein the first Au layer (1) is deposited with a layer thickness of at least 35 nm, and at most 75 nm.

3. Method according to claim 1, wherein before deposition of the first Au layer (1), the back side of the substrate (HS) is polished to less than 4 nm average roughness depth.

4. Method according to claim 1, wherein a second Au layer (3) is deposited between the diffusion barrier layer (2) and the Au conductive layer (4).

5. Method according to claim 1, wherein the diffusion barrier layer (2) consists of at least one refractory metal, particularly of Ti, at least in a region (2a) of a boundary surface to the first Au layer and/or in a region (2c) of the boundary surface to the second Au layer.

6. Method according to claim 1, wherein the diffusion barrier layer contains N at least in a central layer region (2b).

7. Method according to claim 1, wherein the first Au layer (1) and/or the diffusion barrier layer (2) and/or the second Au layer (3) is/are sputtered on.

8. Method according to claim 1, wherein the Au conductive layer (4) is deposited galvanically.

9. Method according to claim 1, wherein before deposition of the back-side metallization (RM), at least one passage hole (DK) through the substrate (HS) is produced, and wherein the back-side metallization is also deposited in the passage hole.

10. Method according to claim 9, wherein at least the first Au layer (1) is deposited with a lesser layer thickness in the passage hole (DK) than on the back side of the substrate.

11. Method according to claim 1, wherein the back-side metallization is a complete back-side metallization.

12. Electronic component (EB) having a GaAs semiconductor substrate (HS) that has at least one semiconductor component (BE) on its substrate front side, and a back-side metallization on the substrate back side, wherein the back-side metallization (RM) contains at least one adhesion layer (1) that stands in contact with the semiconductor material of the substrate, and an Au conductive layer that takes up at least 50% of the total thickness of the back-side metallization,
wherein the adhesion layer is a first Au layer (1); and
comprising a diffusion barrier layer (2) that lies between the first Au layer (1) and the Au conductive layer (4); and
wherein the layer thickness of the diffusion barrier layer (2) is greater than the layer thickness of the first Au layer (1); and wherein the layer thickness of the first Au layer (1) amounts to at least 25 nm and at most 100 nm.

13. Component according to claim 12, wherein the layer thickness of the first Au layer (1) amounts to at least 35 nm, and at most 75 nm.

14. Component according to claim 12, wherein the substrate back side has an average roughness depth of less than 4 nm at the boundary surface to the first Au layer (1).

15. Component according to claim 12, further comprising a second Au layer (3) that lies between the diffusion barrier layer (2) and the Au conductive layer (4).

16. Component according to claim 12, wherein the diffusion barrier layer (2) consists of Ti at least in a region (2a) of a boundary surface to the first Au layer (1) or in a region (2c) of the boundary surface to the second Au layer (3).

17. Component according to claim 12, wherein the diffusion barrier layer (2) contains N at least in a central layer region (2b) and preferably consists of TiN.

18. Component according to claim 12, wherein the first Au layer (1) and/or the diffusion barrier layer (2) and/or the second Au layer (3) is/are sputtered layers.

19. Component according to claim 12, wherein the Au conductive layer (4) is a galvanic layer.

20. Component according to claim 12, wherein at least one passage hole (DK) is present in the substrate, between front side and back side of the substrate, and wherein the back-side metallization (RM) is present also on the walls of the at least one passage hole.

21. Component according to claim 20, wherein the layer thickness of at least the first Au layer (1) is lower on the walls of the passage hole than on the back side of the substrate.

22. Component according to claim 12, wherein the back-side metallization is a complete back-side metallization.

* * * * *